US010062698B2

United States Patent
Guo et al.

(10) Patent No.: US 10,062,698 B2
(45) Date of Patent: Aug. 28, 2018

(54) P-CHANNEL MULTI-TIME PROGRAMMABLE (MTP) MEMORY CELLS

(71) Applicant: GLOBALFOUNDRIES Singapore Pte. Ltd., Singapore (SG)

(72) Inventors: Pengfei Guo, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 159 days.

(21) Appl. No.: 14/952,567

(22) Filed: Nov. 25, 2015

(65) Prior Publication Data

US 2017/0148794 A1    May 25, 2017

(51) Int. Cl.
*H01L 27/105* (2006.01)
*H01L 27/02* (2006.01)

(52) U.S. Cl.
CPC ........ *H01L 27/105* (2013.01); *H01L 27/0207* (2013.01)

(58) Field of Classification Search
CPC ............... H01L 27/105; H01L 27/0207; H01L 27/11558
See application file for complete search history.

(56) References Cited

U.S. PATENT DOCUMENTS

| | | | | |
|---|---|---|---|---|
| 4,437,172 A | * | 3/1984 | Masuoka | G11C 16/0408 257/316 |
| 6,044,018 A | * | 3/2000 | Sung | G11C 16/0441 365/185.1 |
| 2013/0320421 A1 | * | 12/2013 | Chiu | H01L 29/94 257/296 |
| 2015/0054043 A1 | | 2/2015 | Tan et al. | |
| 2015/0069483 A1 | * | 3/2015 | Chen | H01L 27/11558 257/298 |
| 2015/0221663 A1 | | 8/2015 | Tan et al. | |

* cited by examiner

*Primary Examiner* — Bilkis Jahan
*Assistant Examiner* — Victor Barzykin
(74) *Attorney, Agent, or Firm* — Lorenz & Kopf, LLP

(57) ABSTRACT

Multi-time programmable (MTP) memory cells, integrated circuits including MTP memory cells, and methods for fabricating MTP memory cells are provided. In an embodiment, an MTP memory cell includes a semiconductor substrate, a p-well formed in the semiconductor substrate, and an n-well formed in the semiconductor substrate and isolated from the p-well. The MTP memory cell further includes a p-channel transistor disposed over the n-well and including a transistor gate. Also, the MTP memory cell includes a p-channel capacitor disposed over the p-well and including a capacitor gate. The capacitor gate is coupled to the transistor gate.

20 Claims, 3 Drawing Sheets

US 10,062,698 B2

P-CHANNEL MULTI-TIME PROGRAMMABLE (MTP) MEMORY CELLS

TECHNICAL FIELD

The technical field generally relates to multi-time programmable (MTP) memory cells, and more particularly relates to p-channel MTP cells.

BACKGROUND

Multi-time programmable (MTP) memories have been recently introduced for beneficial use in a number of applications where customization is required for both digital and analog designs. These applications include data encryption, reference trimming, manufacturing identification (ID), security ID, and many other applications. Incorporating MTP memories nonetheless also typically comes at the expense of some additional processing steps.

For example, some of the existing approaches to constructing MTP memories require additional masking steps to achieve sufficiently high junction breakdown voltage (BV). Also, some of the existing approaches result in MTP memories having large cell sizes due to design rule requirements. In order to achieve smaller cell sizes, multiple un-proven sub-design rule techniques have to be applied.

Accordingly, it is desirable to provide a simple and cost-free MTP structure to create memory cells with the standard complementary metal oxide semiconductor (CMOS). Further, it is desirable to provide a method for fabricating an improved MTP memory cell. Furthermore, other desirable features and characteristics will become apparent from the subsequent detailed description and the appended claims, taken in conjunction with the accompanying drawings and this background.

BRIEF SUMMARY

Multi-time programmable (MTP) memory cells, integrated circuits including MTP memory cells, and methods for fabricating MTP memory cells are provided. In one embodiment, an MTP memory cell includes a semiconductor substrate, an n-well formed in the semiconductor substrate, and a p-well formed in the semiconductor substrate and isolated from the n-well. The MTP memory cell further includes a p-channel transistor disposed over the n-well and including a transistor gate. Also, the MTP memory cell includes a p-channel capacitor disposed over the p-well and including a capacitor gate. The capacitor gate is coupled to the transistor gate.

In another exemplary embodiment, an integrated circuit device is provided. The integrated circuit device includes a semiconductor substrate and a multi-time programmable (MTP) memory cell formed in and/or on the semiconductor substrate. The MTP memory cell includes an n-well formed in the semiconductor substrate and a p-well formed in the semiconductor substrate and isolated from the n-well. Also, the MTP memory cell includes a p-channel transistor disposed over the n-well and including a p-channel transistor gate. Further, the MTP memory cell includes a device disposed over the p-well and including a device gate. The p-channel transistor gate is coupled to the device gate.

In yet another exemplary embodiment, a method for fabricating a multi-time programmable (MTP) memory cell is provided. The method includes providing a semiconductor substrate. The method forms a p-well in the semiconductor substrate and forms an n-well in the semiconductor substrate. The n-well is isolated from the p-well. The method includes forming a p-channel transistor disposed over the n-well and including a transistor gate. Also, the method includes forming a p-channel capacitor disposed over the p-well and including a capacitor gate. The method couples the capacitor gate to the transistor gate.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the MTP memory cells, integrated circuits including MTP memory cells, or methods for fabricating MTP memory cells. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and process steps described herein may be incorporated into a more comprehensive procedure or process having additional steps or functionality not described in detail herein. In particular, various steps in the fabrication of memory cells are well-known and so, in the interest of brevity, many conventional steps will only be mentioned briefly herein or will be omitted entirely without providing the well-known process details. Further, it is noted that memory cells and devices having memory cells include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, an MTP memory cell includes a p-channel transistor and a p-channel capacitor. The p-channel transistor includes a floating gate and the p-channel capacitor includes a control gate. The process for forming such a memory cells adds no additional masks to an existing process flow for forming integrated circuits. Further, the p-channel MTP memory cell provides for reduced cell size as compared to conventional n-channel MTP memory cells.

Figure 1:
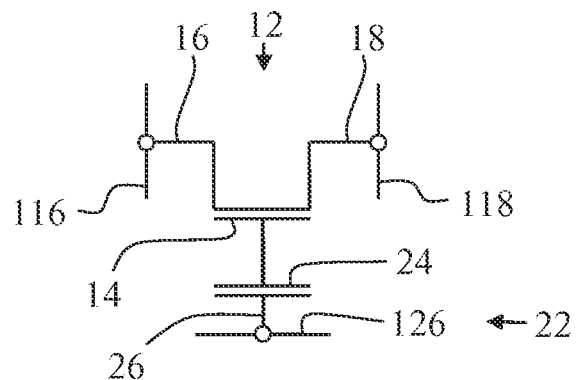
FIG. 1 is a schematic diagram of a p-channel MTP memory cell in accordance with an embodiment herein.
Figure 2:
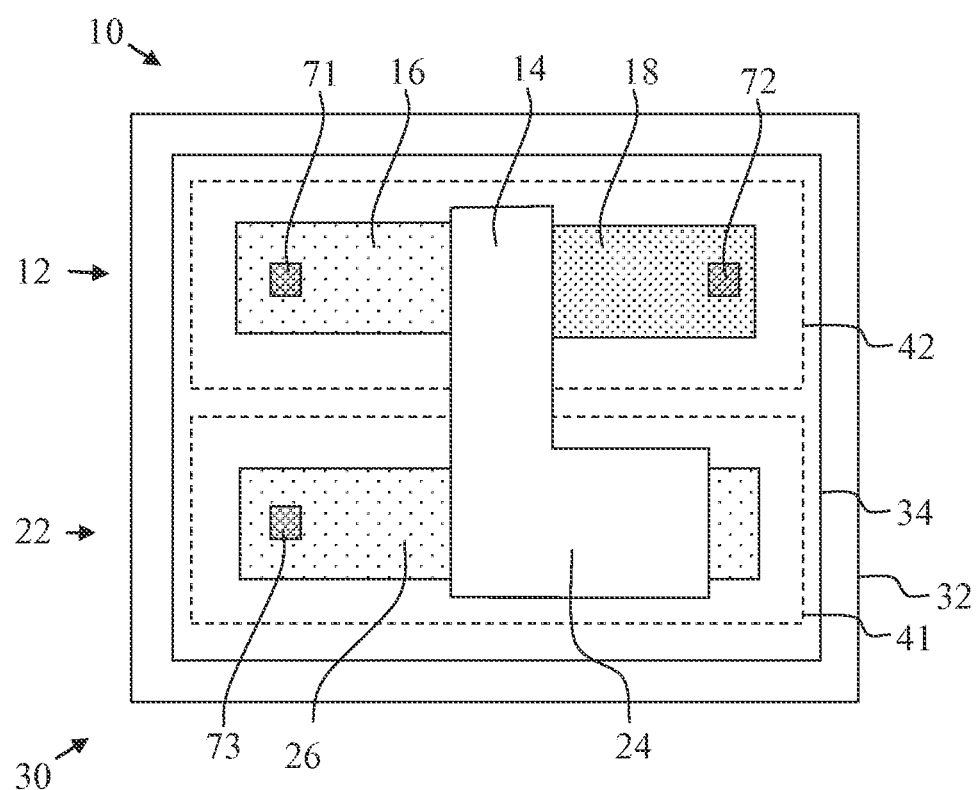
FIG. 2 provides a top view of an embodiment of a p-channel MTP memory cell.
Figure 3:
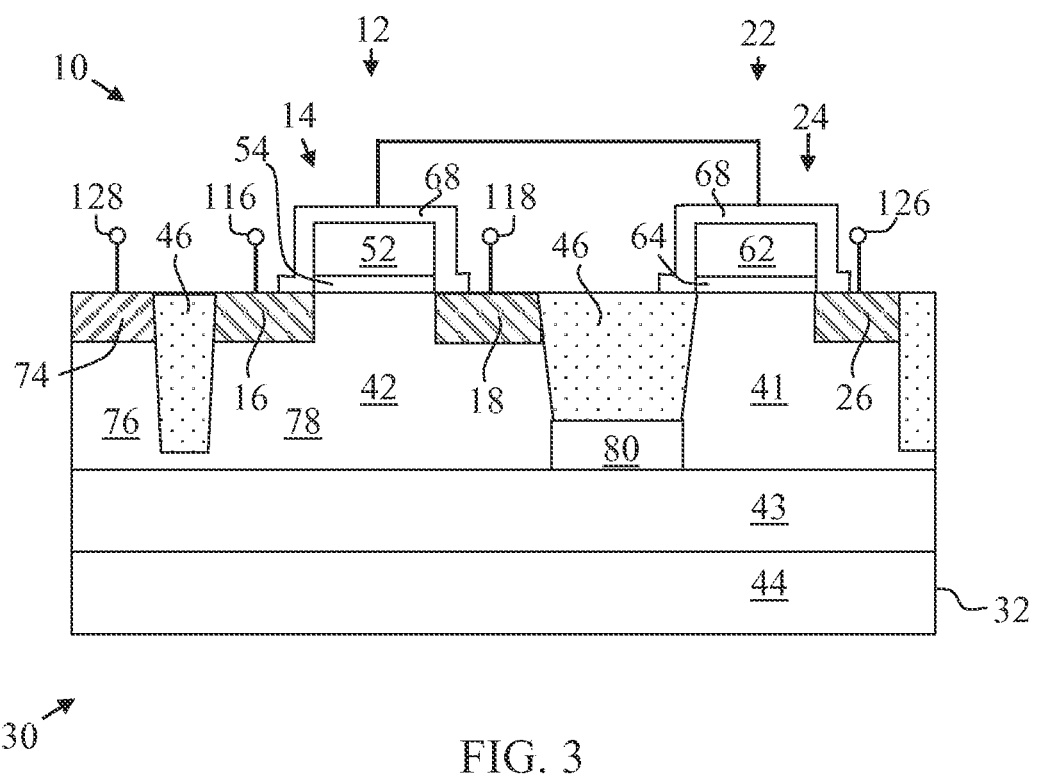
FIG. 3 provides a cross section view of an embodiment of a p-channel MTP memory cell.
Figure 4:
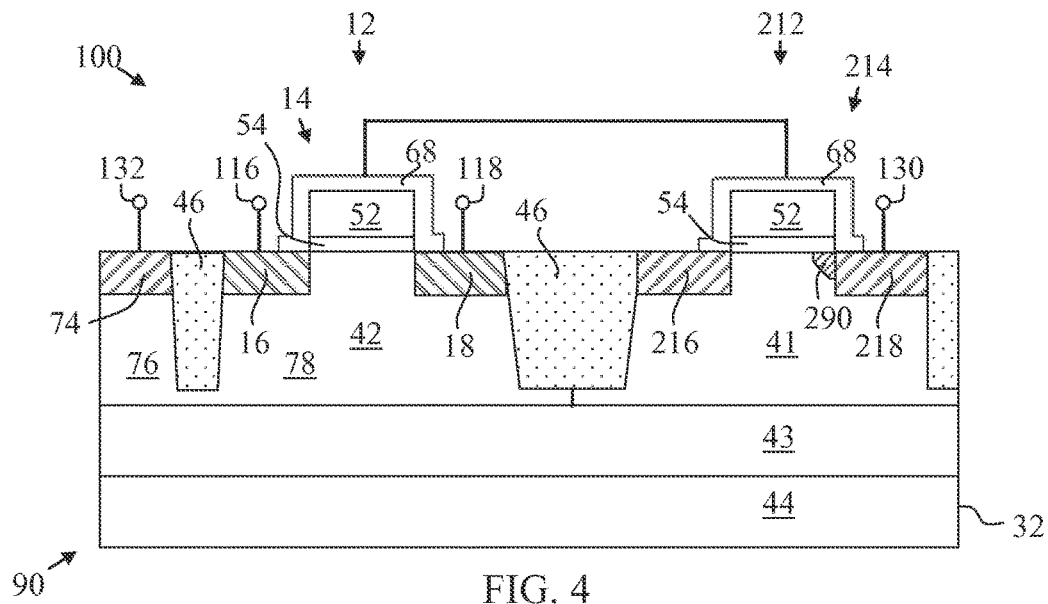
FIGS. 4 and 5 provide cross section views of a p-channel MTP memory cell further including an additional n-channel transistor in accordance with embodiments herein.
Figure 5:
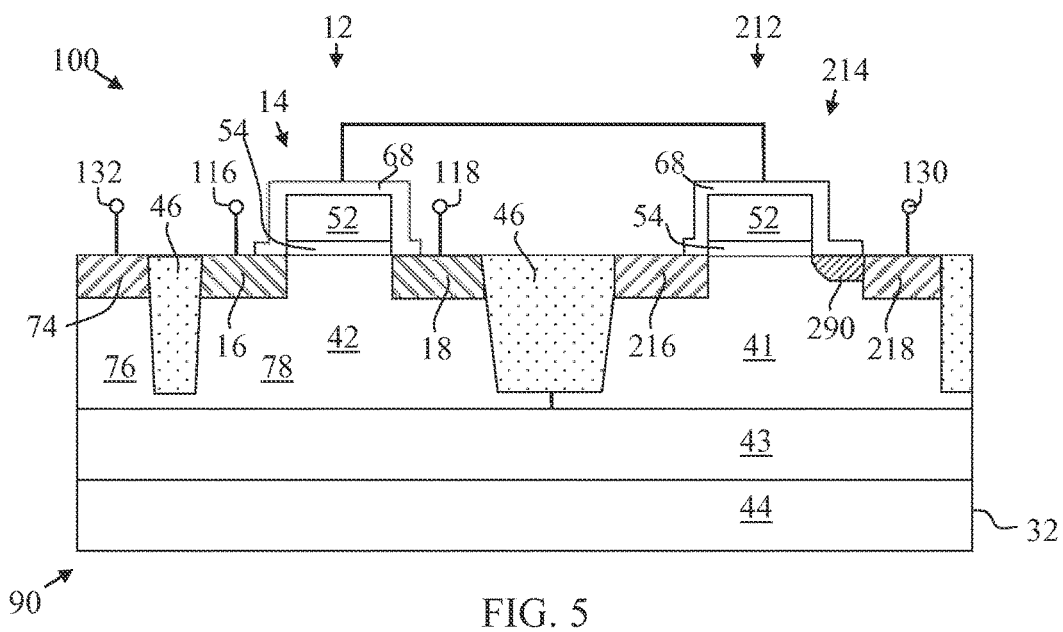

FIG. 1 is a schematic diagram of an embodiment of a p-channel MTP memory cell. FIG. 2 provides a top view of an embodiment of a p-channel MTP memory cell. FIG. 3 provides a cross section view of an embodiment of a p-channel MTP memory cell. FIGS. 4 and 5 provide cross section views of embodiments including an additional n-channel transistor provided as a terminal for applying a high voltage during an erase process.

Embodiments herein generally relate to semiconductor devices. More particularly, some embodiments relate to memory devices, such as non-volatile memory (NVM) devices. Such memory devices, for example, can be incorporated into standalone memory devices, such as USB or other types of portable storage units, or integrated circuits, such as microcontrollers or system on chips (SoCs). The devices or integrated circuits can be incorporated into or used with, for example, consumer electronic products or relate to other types of devices.

FIG. 1 shows a schematic diagram of an embodiment of a memory cell 10. The memory cell 10, in one embodiment, is a multi-time programmable (MTP) memory cell 10, such as a non-volatile (NV) MTP. As shown in FIG. 1, memory cell 10 includes a transistor 12 and a capacitor 22.

An exemplary transistor 12 is a metal oxide semiconductor (MOS) transistor. The exemplary transistor 12 includes a gate 14 between first and second diffusion regions 16 and 18, i.e., source and drain regions 16 and 18. An exemplary capacitor 22 is a MOS capacitor. The exemplary capacitor 22 includes a gate 24. A diffusion region 26 is disposed adjacent to the gate 24.

In the exemplary embodiment, the transistor 12 is a storage transistor and the transistor gate 14 may be considered a storage gate. Further, the capacitor 22 may be a control capacitor and the capacitor gate 24 may be considered a control gate.

As illustrated in FIG. 1, the gate 14 and the control gate 24 are commonly coupled. By commonly coupling the gate 14 and the control gate 24, the gate 14 is formed as a floating gate. In one embodiment, a common gate electrode is provided for the floating gate 14 and the control gate 24. Other configurations of the floating and control gates may also be useful.

In the embodiment illustrated in FIG. 1, the first diffusion region 16 of transistor 12 is coupled to a bit line (BL) 116 of the memory cell 10. The second diffusion region 18 of transistor 12 is coupled to a source line (SL) 118 of the memory cell 10. The diffusion region 26 of the control capacitor 22 is coupled to a control gate line (CGL) 126 of the memory cell 10. In one embodiment, the control gate line 126 is disposed along a first direction, such as a word line direction, while the bit line 116 and source line 118 are disposed along a second direction, such as the bit line direction. The first and second directions, for example, are orthogonal to each other. Other configurations of bit line 116, source line 118, and control gate line 126 may also be useful. For example, the source line 118 may be a common source line for memory cells of an array.

FIG. 2 shows a top view of one embodiment of a device 30 including a memory cell 10. FIG. 3 shows a cross sectional view of an embodiment of a device 30 (with schematics of metal lines) including a memory cell 10. As shown in FIGS. 2 and 3, device 30 is disposed on a semiconductor substrate 32. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 32 may include a compound semiconductor such as silicon carbide, silicon germanide, gallium arsenide, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated.

The device 30 may include doped regions having different dopant concentrations. For example, the device 30 may include heavily doped (x+), intermediately doped (x), and lightly doped (x−) regions, where x is the p-type or n-type dopant polarity type. A lightly doped (x−) region may have a dopant concentration of about 1E11-1E13 cm−2, an intermediately doped (x) region may have a dopant concentration of about 1E13-1E19 cm−2, and a heavily doped (x+) region may have a dopant concentration of about 1E20 cm−2. Providing other dopant concentrations for the different types of doped regions may also be useful. For example, the dopant concentration ranges may be varied, depending on the technology node. P-type dopants may include boron (B), aluminum (Al), indium (In) or a combination thereof, while n-type dopants may include phosphorous (P), arsenic (As), antimony (Sb) or a combination thereof.

As shown in FIG. 2, a cell region 34 is provided in the semiconductor substrate 32. The cell region 34, for example, is a cell region in which the memory cell 10 is disposed. Although one cell region 34 is shown, the device 30 may include a plurality of cell regions 34 having multiple memory cells 10 interconnected to form a memory array. Additionally, the semiconductor substrate 32 may include other types of device regions, depending on the types of device or IC. For example, the device 30 may include device regions for high voltage (HV), intermediate or medium voltage (MV) and/or low voltage (LV) devices.

As shown in FIGS. 2 and 3, the cell region 34 includes a first well 41 and a second well 42. The first well 41 serves as a control well for control gate 24 of control capacitor 22 while the second well 42 serves as a well for gate 14 of transistor 12. As shown, the first well 41 and second well 42 are disposed adjacent to each other. The first well 41 accommodates the control capacitor 22 and the second well 42 accommodates the transistor 12. The control well 41 includes control well dopants and the transistor well 42 includes transistor well dopants. The control well 41 may have a light dopant concentration. For example, the dopant concentration of the control well 41 may be about 1E11-1E13 cm−2. The transistor well 42 may be lightly doped with transistor well dopants. For example, the dopant concentration of storage well dopants in the transistor well 42 may be about 1E11-1E13 cm−2. Other control and/or storage well dopant concentrations may also be useful. In one embodiment, the wells 41 and 42 are tailored for MV devices. For example, wells for MV and LV devices may include different dopant concentrations to accommodate different gate configurations, such as a thicker gate dielectric layer for MV devices.

The MV wells 41 and 42 may be formed over a HV well 43, as shown in FIG. 3. An exemplary HV well 43 is p-doped. Further, the HV well 43 may be formed over a deep well 44. An exemplary deep well 44 is n-doped.

The polarity type of the control well 41 depends on the desired polarity type of the control capacitor 22. In the case of control capacitors, the control well 41 is formed with the same polarity as the capacitor type. Herein, the control capacitor 22 is a p-type capacitor. Therefore, the control well dopant is p-type. The polarity type of the transistor well 42 is the opposite of the desired polarity of the transistor 12. Herein, the transistor 12 is a p-type transistor. Therefore, the storage transistor well dopants are n-type.

A cell isolation region 46, as shown, separates the first well 41 and the second well 42, as well as the other device regions. The cell isolation region 46 sufficiently isolates the different wells. For example, the cell isolation region 46 provides sufficient overlap to the different wells. The cell isolation region 46 defines the active region in the first well 41 and the second well 42. For example the cell isolation region 46 defines the active transistor region of the transistor 12 in the second well 42 and active capacitor region of the capacitor 22 in the first well 41. The cell isolation region 46 is, for example, a shallow trench isolation region. Other types of isolation regions may also be useful.

In FIGS. 2 and 3, transistor 12 is disposed in the transistor active region in the second or transistor well 42. Transistor 12 includes gate 14 between first and second diffusion regions 16 and 18. For example, the gate 14 is formed over the semiconductor substrate 32 and between the first and second diffusion regions 16 and 18 formed in the semiconductor substrate 32.

As shown in FIG. 3, the gate 14 includes a gate electrode 52 overlying a gate dielectric 54 located on the semiconductor substrate 32. The gate electrode 52, for example, may be a polysilicon gate electrode. The gate dielectric 54, for example, may be an oxide such as a silicon oxide gate dielectric. An exemplary gate dielectric 54 should be sufficient to serve as a storage dielectric for the transistor 12. For example, the gate dielectric 54 should be sufficiently thick to prevent or reduce electron leakage of the transistor 12. Other types of gate electrode or dielectric materials may also be useful.

As shown, the gate 14 is formed between the first diffusion region 16 and the second diffusion region 18. The diffusion regions 16 and 18 of transistor 12 are heavily doped regions with first polarity type dopants. The polarity type determines the type of transistor. Herein, the first polarity, i.e., the polarity of first and second diffusion regions 16 and 18, is p-type and the transistor 12 is a p-type transistor. The transistor diffusion regions have a depth DT.

Transistor diffusion regions 16 and 18, in one embodiment, may include base halo and lightly doped drain (LDD) regions (not shown). A halo region is a lightly doped region with second polarity type dopants. An LDD region is a lightly doped region with first polarity type dopants. For example, the halo region includes n-type dopants for p-type transistor 12 while the LDD region includes p-type dopants for p-type transistor 12. The dopant concentrations of the halo and LDD regions are lower than those of the transistor diffusion regions 16 and 18. In general, the dopant concentration of the LDD is heavier or higher than the halo region. For example, the dopant concentration of the base halo region is about 1E12 cm−3 and the dopant concentration of the base LDD region is about 1E13 cm−3. Providing other dopant concentrations for the base LDD and halo regions may also be useful. For example, the dopant concentrations may be varied depending on the technology node. A depth of the LDD region is DL and a depth of the halo region is DH. The depths DL and DH are shallower than DT. In general, the LDD region is shallower than the halo region. For example, DL is less than DH (DL<DH). The halo and LDD regions may extend under the gate 14. In one embodiment, a halo region extends further below the gate 14 than a LDD region. In other words, the halo region extends beyond the LDD region.

Dielectric spacers (not shown) may be provided on the sidewalls of the gate 14 of transistor 12. The spacers may be used to facilitate forming transistor halo, LDD and transistor diffusion regions. For example, spacers may be formed after halo and LDD regions are formed. Spacers may be formed by, for example, forming a spacer layer on the substrate and anisotropically etching it to remove horizontal portions, leaving the spacers on sidewalls of the gates. After forming the spacers, an implant is performed to form the transistor diffusion regions.

In another embodiment, a transistor diffusion region 16 or 18 includes a LDD region without a halo region. For example, the transistor diffusion regions 16 and 18 include base LDD regions without base halo regions. In the case where the transistor diffusion regions 16 and 18 include only LDD regions, a second implant provides a second LDD region in the first diffusion region 16, adding to the dopant concentration of the base LDD region to result in an asymmetric LDD region. For example, the first diffusion region 16 of the transistor 12 includes an asymmetrical LDD region without an asymmetrical halo region. Other configurations of the transistor diffusion regions 16 and 18 may also be useful.

Furthermore, the asymmetrical halo and LDD regions, as described, may be formed by a second implant. The second implant, for example, may be an implant used to form halo and LDD regions of other devices, such as HV and/or LV devices of the same polarity type as the storage and access transistors. For example, a first halo and LDD implant of HV and/or LV devices may be a second implant of other devices, such as MV devices. This enables the same mask used to form the halo and LDD regions of HV and/or LV devices to be used to form the asymmetrical halo and LDD regions of the storage transistor. The use of the same mask enables the asymmetrical device to be formed without the need of extra masks, reducing costs.

In FIGS. 2 and 3, control capacitor 22 is disposed in the capacitor active region in the first or control well 41. The control capacitor 22 includes a control gate 24 disposed over the semiconductor substrate 32 and over the diffusion region 26 within the first well 41.

As shown in FIG. 3, the control gate 24 includes a control gate electrode 62 overlying a control gate dielectric 64 located on the semiconductor substrate 32. The control gate electrode 62, for example, may be a polysilicon control gate electrode. The control gate dielectric 64, for example, may be an oxide such as a silicon oxide control gate dielectric. Other types of gate electrode or dielectric materials may also be useful. The control gate electrode, in one embodiment, is doped with control or capacitor type dopants. For example, the control gate electrode 62 is heavily doped with dopants of the same polarity type dopants as the control well 41.

Capacitor diffusion region 26 is disposed in the semiconductor substrate 32 adjacent to the control gate 24. The capacitor diffusion region 26, in one embodiment, is heavily doped with control or capacitor type dopants. The capacitor diffusion region 26 serves as a contact region to a well capacitor plate while the gate electrode serves as the other (or gate capacitor) plate. In one embodiment, the capacitor gate electrode 62 is doped before forming the capacitor diffusion region 26. For example, a gate electrode layer deposited on the substrate is pre-doped with control dopants and patterned to form the capacitor gate electrode 62. Because the diffusion regions of the capacitor and transistor are doped with dopants of the same polarity, the diffusion regions 16, 18 and 26 may be formed at the same time.

In one embodiment, the transistor gate 14 and capacitor gate 24 are commonly coupled. In one embodiment, the transistor gate 14 and capacitor gate 24 form an integral unit. For example, the transistor gate 14 and capacitor gate 24 may be formed of the same gate layer or layers. For example, patterning same gate layers create the transistor gate 14 and capacitor gate 24 as a unit. In such cases, the transistor gate 14 and capacitor gate 24 are formed of the same material. For example, the transistor gate electrode and capacitor gate electrode are doped with same type (p-type) dopants. In one embodiment, the transistor gate 14 and capacitor gate 24 are formed from the same gate layer. Other configurations of the gates may also be useful. For example, the gates may be formed from different gate layers.

Metal silicide contacts (not shown) may be provided on contact regions of the memory cell. The metal silicide contacts, for example, may be nickel or nickel-based metal silicide contacts. Other types of metal silicide contacts may also be useful. In one embodiment, metal silicide contacts are provided on the diffusion regions of the transistor and capacitor. A silicide block 68 (shown in FIG. 3) is disposed over the transistor gate 14 and capacitor gate 24. The silicide block 68, for example, is a dielectric material, such as silicon oxide. Other types of silicide blocks may also be useful. The silicide block 68 prevents formation of silicide contacts over the transistor gate 14 and capacitor gate 24. This improves data retention.

In FIG. 3, the first diffusion region 16 is shown to be coupled to bit line 116 of the memory cell 10 through a contact 71, the second diffusion region 18 is coupled to source line 118 of the memory cell 10 through a contact 72, and the control diffusion region 26 is coupled to control gate line 126 of the memory cell 10 through a contact 73.

As further shown in FIG. 3, a diffusion region 74 may be formed in the second or transistor well 42 to provide for electrical connection between the well 42 and a well line 128. For this purpose, the diffusion region 74 may be heavily doped with n-type dopants to interconnect the n-doped well 42 and the well line 128. As shown, the diffusion region 74 is formed in a portion 76 of the second well 42 that is isolated from the portion 78 of the second well where diffusion regions 16 and 18 are formed by an isolation region 46.

The various lines 116, 118, 126, and 128 of the memory cell 10 may be disposed in metal levels (M) of the device 30. The conductive lines disposed in the same direction may be provided in the same metal level. For example, bit line 116 and source line 118 may be disposed on the same level while control gate line 126 and well line 128 are disposed on a different level. Other configurations of conductive lines and metal levels may also be useful.

In order to improve breakdown voltage (BV) performance, the device 30 may be provided with an undoped or native region 80. As shown, native region 80 lies under isolation region 46 and serves to further isolate the wells 41 and 42 from one another. Native region 80 is masked during doping of the first well 41 and second well 42.

As an illustration, the device as described in FIGS. 1-3 may be formed by an exemplary semiconductor manufacturing process. In one embodiment, the process of forming the device includes providing a semiconductor substrate 32. The semiconductor substrate 32 may be prepared with a deep well 44, such as an n-type deep well and an HV well 43, such as a p-type HV well, overlying the n-type deep well 44, to accommodate other devices, such as HV devices, on the semiconductor substrate 32. The semiconductor substrate 32 may be prepared with one or more device or cell regions. A cell region 34 is isolated from another cell region by forming cell isolation regions 46, such as shallow trench isolation (STI) regions. A well is formed in each device region to accommodate various devices, such as MV and/or LV devices. For example, a p-well 41 is formed in the capacitor region and an n-well 42 is formed in the transistor region. The native region 80 is masked during formation of the wells 41 and 42 in the capacitor and transistor regions such that the native region 80 remains undoped. The native region 80 and the cell isolation region 46 completely isolate the capacitor region well 41 and the transistor region well 42.

A gate dielectric layer is deposited on the substrate and across the device regions to form gate dielectric layers of the various devices. For example, a silicon oxide layer is formed on the substrate 32 to form gate dielectric layers. The gate dielectric layer is formed with different thicknesses for different device regions. A gate dielectric layer of a MV device, for example, may be thicker than a gate dielectric layer of a LV device. For example, an exemplary gate oxide layer of an MV device may be sufficiently thick to prevent electron leakage. In one embodiment, a gate electrode layer, such as a polysilicon layer, is deposited on the gate dielectric layer and the gate electrode layer and gate dielectric layer are patterned to form gate electrodes 52 and 62 and gate dielectric 54 and 64 of the various devices. In one embodiment, the gate electrode layer is a doped polysilicon layer. For example, a gate electrode layer of a control gate is pre-doped with control or capacitor type dopants to form the control gate. Other gate electrodes may also be suitably doped to form gates of other devices. The gate electrode and gate dielectric layers are patterned to form transistor gates of devices, such as HV, MV and/or LV devices.

As described, HV, MV and/or LV devices may be formed on the same semiconductor substrate 32. The process may continue to form a memory cell 10, such as a MTP memory cell. The memory cell 10, in one embodiment, is made of MV device. For example, a transistor 12 of the memory cell is an MV transistor and a capacitor 22 of the memory cell is an MV capacitor.

A dielectric spacer layer may be deposited on the semiconductor substrate 32. The dielectric spacer may be patterned to form gate sidewall spacers. In one embodiment, the exposed substrate regions adjacent to the sidewall spacers are heavily doped with transistor type dopants to form diffusion regions 16 and 18. In one embodiment, diffusion regions 16 and 18 are formed adjacent to the sides of the transistor gate 14 (including the spacers) and diffusion region 26 is formed adjacent to a side of the capacitor gate 24 (including a spacer). A common implant mask may be employed, for example, to form the diffusion regions 16, 18 and 26. P-type dopants may be implanted to form diffusion regions 16, 18 and 26. Further, another implant mask may be employed to form diffusion region 74, where n-type dopants may be implanted. Other techniques may also be used to form the diffusion regions.

The process continues to complete forming the device. The processing may include forming an interlayer dielectric (ILD) layer, contacts to the terminals of the memory cell as well as one or more interconnect levels, final passivation, dicing, assembly and packaging. Other processes to complete forming the device may also be included. Other process to form the device, as described in FIGS. 1-3 may also be useful.

The memory cell described has improved performance while providing reduced cell size as compared to conventional processing. Further, fabrication of the memory cell requires no additional masks, as the memory cell may be formed using a conventional process flow.

For conventional n-channel MTP memory cells, design rules require sufficient minimum spacing from N+ to NW regions and from NW to NW regions. Such minimum spacing requirements hinder further scaling of devices. Herein, p-channel MTP memory cells avoid use of N+ to NW structures. Thus, such p-channel MTP memory cells are not inhibited by the design rule for N+ to NW minimum spacing. Rather, p-channel MTP memory cells utilize P+ to PW structures that are governed by more lenient design rules for P+ to PW minimum spacing. Specifically, the P+ to PW minimum spacing is smaller than N+ to NW minimum spacing. In conventional n-channel MTP memory cell processing, reduction of N+ to NW spacing leads to a decrease in breakdown voltage sufficient to risk device failure. Herein, P+ to PW spacing may be reduced to form smaller MTP memory cells than possible with n-channel MTP memory cells.

In the described memory cell, programming may be performed by channel hot hole induced hot electron injection. Further, erase may be performed by FN tunneling to channel. Such a process does not depending on the drain-source breakdown voltage (BVdss).

FIGS. 4 and 5 illustrate embodiments of devices provided for improved erase performance. In FIGS. 4 and 5, cross section views are provided of a device 90 including a memory cell 100. As shown, the device 90 and memory cell 100 share many similar components with device 30 and memory cell 10 of FIG. 3 and may be formed in conjunction with and in addition to device 30. For example, device 90 includes a deep well 44 that is n-doped. Further, device 90 includes p-type HV well 43 overlying the deep well 44. Also, device 90 includes a p-doped first well 41, an n-doped second well 42, and an isolation region 46 separating the wells 41 and 42, as described in relation to the device 30.

Device 90 includes a transistor 12 formed over the second well 42 and including a gate 14 with a gate dielectric 54 and gate electrode 52 as well as p-doped diffusion regions 16 and 18 connected to a bit line 116 and source line 118, respectively, similar to that shown in FIG. 3. Also, device 90 includes an n-doped diffusion region 74.

Unlike the device 30 of FIG. 3, device 90 includes a transistor 212 over first well 41 rather than a capacitor 22. In FIG. 4, the transistor 212 is shown to include a gate 214 including a gate electrode 52 overlying a gate dielectric 54 located on the semiconductor substrate 32. The gate electrode 52, for example, may be a polysilicon gate electrode. The gate dielectric 54, for example, may be an oxide such as a silicon oxide gate dielectric. An exemplary gate dielectric 54 should be sufficient to serve as a dielectric for the transistor 212. For example, the gate dielectric 54 should be sufficiently thick to prevent or reduce electron leakage of the transistor 212. Other types of gate electrode or dielectric materials may also be useful.

As shown in FIGS. 4 and 5, the gate 214 is formed between a first diffusion region 216, such as a source region, and a second diffusion region 218, such as a drain region. The diffusion regions 216 and 218 of transistor 212 are heavily doped regions with second polarity type dopants. Herein, the second polarity, i.e., the polarity of first and second diffusion regions 216 and 218, is n-type and the transistor 212 is an n-channel transistor. The transistor diffusion regions have a depth DT. Also, a lightly doped drain (LDD) region 290 is located between the diffusion region 218 and the channel region between the diffusion regions 216 and 218. LDD region 290 is a lightly doped region with second polarity type dopants. For example, the LDD region 290 includes n-type dopants for n-type transistor 212. The dopant concentration of the LDD region 290 is lower than that of the transistor diffusion regions 218. The dopant concentration of the base LDD region 290 is about 1E13 cm−3. Providing other dopant concentrations for the base LDD may also be useful. A depth of the LDD region is DL, which is shallower than DT. The LDD region 290 may extend under the gate 214.

While FIG. 4 illustrates a diffusion region 218 aligned with gate 214, FIG. 5 illustrates an alternative embodiment in which diffusion region 218 is not aligned with gate 214. The non-self-aligned structure helps to improve the junction breakdown voltage, allowing a better efficiency and a short erase time. In FIG. 5, the LDD region 290 separates the diffusion region 218 from the gate 214.

Dielectric spacers (not shown) may be provided on the sidewalls of the gate 214 of transistor 212. The spacers may be used to facilitate forming transistor LDD and transistor diffusion regions. For example, spacers may be formed after the LDD region is formed. Spacers may be formed by, for example, forming a spacer layer on the substrate and anisotropically etching it to remove horizontal portions, leaving the spacers on sidewalls of the gates. After forming the spacers, an implant is performed to form the transistor diffusion regions. Thus, the diffusion regions may be self-aligned with the spacers of the gate structure. Because the well diffusion region 74 and the diffusion regions 216 and 218 of the transistor 212 are doped with dopants of the same polarity, the diffusion regions 74, 216 and 218 may be formed at the same time.

In one embodiment, the transistor gate 14 and transistor gate 214 are commonly coupled. In one embodiment, the transistor gate 14 and transistor gate 214 form an integral unit. For example, the transistor gate 214 and transistor gate 214 may be formed of the same gate layer or layers. For example, patterning same gate layers create the transistor gate 14 and transistor gate 214 as a unit. In such cases, the transistor gate 14 and transistor gate 214 are formed of the same material. For example, the transistor gate electrode and capacitor gate electrode are doped with same type (p-type) dopants. In one embodiment, the transistor gate 14 and transistor gate 214 are formed from the same gate layer. Other configurations of the gates may also be useful. For example, the gates may be formed from different gate layers.

Metal silicide contacts (not shown) may be provided on contact regions of the memory cell of FIG. 4 or 5. The metal silicide contacts, for example, may be nickel or nickel-based metal silicide contacts. Other types of metal silicide contacts may also be useful. In one embodiment, metal silicide contacts are provided on the diffusion regions of the transistor and capacitor. A silicide block 68 is disposed over the transistor gate 14, transistor gate 214, and LDD region 290. The silicide block 68, for example, is a dielectric material, such as silicon oxide. Other types of silicide blocks may also be useful. The silicide block 68 prevents formation of silicide contacts over the transistor gate 14, transistor gate 214, and LDD region 290.

In FIGS. 4 and 5, diffusion region 218 is shown to be coupled to erase gate line 130. Further, n-doped diffusion region 74 is coupled to a p-well line 132. The various lines 116, 118, 130 and 132 of the memory cell may be disposed in metal levels (M) of the device 90. The conductive lines disposed in the same direction may be provided in the same metal level. For example, bit line 116 and source line 118 may be disposed on the same level while erase gate line 130 and well line 132 are disposed on a different level. Other configurations of conductive lines and metal levels may also be useful. As described above, the diffusion region 218 of FIG. 5 is non-aligned with the transistor gate 214. As a result, a relatively higher erase voltage may be applied to the erase gate line 130.

As described herein, memory cells are provided with improved performance at reduced cell sizes. Specifically, a p-channel MTP device is provided and includes a p-channel transistors and a p-channel capacitor. Erase performance may be improved by including an n-channel transistor as a terminal to apply a high voltage to the floating gate of the p-channel transistor.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A multi-time programmable (MTP) memory cell comprising:
    a semiconductor substrate;
    an isolation region formed in the semiconductor substrate and extending to a first depth;
    an n-well formed in the semiconductor substrate and extending to a second depth greater than the first depth;
    a p-channel transistor disposed over the n-well and including a transistor gate;
    a p-well formed in the semiconductor substrate and extending to a third depth greater than the first depth, wherein the p-well contacts the isolation region at the first depth and is isolated from the n-well by the isolation region; and
    a p-channel capacitor disposed over the p-well and including a capacitor gate, wherein the capacitor gate is coupled to the transistor gate.

2. The MTP memory cell of claim 1 wherein the second depth is equal to the third depth.

3. The MTP memory cell of claim 1 further comprising a p-doped deep well formed in the semiconductor substrate, wherein the n-well lies above and directly in contact with the p-doped deep well, and wherein the p-well lies above and directly in contact with the p-doped deep well.

4. The MTP memory cell of claim 1 further comprising a p-doped deep well formed in the semiconductor substrate, wherein the n-well lies above the p-doped deep well, and wherein the p-well lies above the p-doped deep well.

5. The MTP memory cell of claim 1 further comprising:
    an n-doped deep well formed in the semiconductor substrate; and
    a p-doped deep well formed in the semiconductor substrate and lying over the n-doped deep well, wherein the n-well lies over the p-doped deep well, and wherein the p-well lies over the p-doped deep well.

6. The MTP memory cell of claim 1 further comprising:
    a p-doped deep well formed in the semiconductor substrate; and
    a native undoped region of the semiconductor substrate located between the isolation region and the p-doped deep well.

7. The MTP memory cell of claim 1 wherein the n-well is isolated from the p-well by a native undoped region of the semiconductor substrate and the isolation region overlying the native undoped region.

8. The MTP memory cell of claim 1 further comprising an erase terminal coupled to the transistor gate.

9. The MTP memory cell of claim 8 wherein the erase terminal comprises an n-channel transistor.

10. The MTP memory cell of claim 9 wherein the n-channel transistor is formed over the p-well.

11. The MTP memory cell of claim 10 wherein the n-channel transistor includes a first n-doped diffusion region, a second n-doped diffusion region, and an n-channel transistor gate between the first n-doped diffusion region and the second n-doped diffusion region.

12. The MTP memory cell of claim 11 wherein the second n-doped diffusion region is coupled to an erase gate line.

13. The MTP memory cell of claim 11 wherein the n-channel transistor includes a lightly doped drain region, and wherein the second n-doped diffusion region is separated from the n-channel transistor gate by the lightly doped drain region.

14. The MTP memory cell of claim 1 wherein the isolation region extends from an upper surface to the first depth, and wherein the p-well contacts the isolation region continuously from the upper surface to the first depth.

15. A multi-time programmable (MTP) memory cell comprising:
    a semiconductor substrate;
    a p-doped deep well formed in the semiconductor substrate;
    a shallow isolation region formed in the semiconductor substrate;
    a native undoped region of the semiconductor substrate located between the shallow isolation region and the p-doped deep well;
    an n-well formed in the semiconductor substrate;
    a p-channel transistor disposed over the n-well and including a transistor gate;
    a p-well formed in the semiconductor substrate and isolated from the n-well by the native undoped region of the semiconductor substrate and the shallow isolation region; and a p-channel capacitor disposed over the p-well and including a capacitor gate, wherein the capacitor gate is coupled to the transistor gate.

16. A multi-time programmable (MTP) memory cell comprising:
- a semiconductor substrate;
- an n-well formed in the semiconductor substrate;
- a p-channel transistor disposed over the n-well and including a transistor gate;
- a p-well formed in the semiconductor substrate and isolated from the n-well;
- a p-channel capacitor disposed over the p-well and including a capacitor gate, wherein the capacitor gate is coupled to the transistor gate; and
- an erase terminal formed over the p-well and coupled to the transistor gate.

17. The MTP memory cell of claim 16 wherein the erase terminal comprises an n-channel transistor.

18. The MTP memory cell of claim 16 wherein the erase terminal comprises an n-channel transistor, and wherein the n-channel transistor includes a first n-doped diffusion region, a second n-doped diffusion region, and an n-channel transistor gate between the first n-doped diffusion region and the second n-doped diffusion region.

19. The MTP memory cell of claim 16 wherein the erase terminal comprises an n-channel transistor; wherein the n-channel transistor includes a first n-doped diffusion region, a second n-doped diffusion region, and an n-channel transistor gate between the first n-doped diffusion region and the second n-doped diffusion region; and
   wherein the second n-doped diffusion region is coupled to an erase gate line.

20. The MTP memory cell of claim 16 wherein the erase terminal comprises an n-channel transistor; wherein the n-channel transistor includes a first n-doped diffusion region, a second n-doped diffusion region, and an n-channel transistor gate between the first n-doped diffusion region and the second n-doped diffusion region; wherein the n-channel transistor includes a lightly doped drain region; and wherein the second n-doped diffusion region is separated from the n-channel transistor gate by the lightly doped drain region.

* * * * *